United States Patent [19]
Poinelli et al.

[11] Patent Number: 5,793,613
[45] Date of Patent: Aug. 11, 1998

[54] HEAT-DISSIPATING AND SUPPORTING STRUCTURE FOR A PLASTIC PACKAGE WITH A FULLY INSULATED HEAT SINK FOR AN ELECTRONIC DEVICE

[75] Inventors: Renato Poinelli, Casatenovo; Marziano Corno, Vaprio D'Adda, both of Italy

[73] Assignee: SGS-Thomson Microelectronics S.r.l., Agrate Brianza, Italy

[21] Appl. No.: 777,295

[22] Filed: Dec. 27, 1996

[51] Int. Cl.⁶ ............................................. H05K 7/20
[52] U.S. Cl. .................... 361/723; 257/675; 257/796; 264/272.17; 437/211
[58] Field of Search ................................ 437/211, 220; 29/827, 841, 855; 165/80.3, 185; 174/16.3, 52.2, 52.4; 257/675, 687, 702, 706, 707, 713, 787, 796; 264/272.11, 272.14, 272.15, 272.17; 361/704–711, 714, 717, 718, 722, 723, 813

[56] References Cited

U.S. PATENT DOCUMENTS

| | | | |
|---|---|---|---|
| 5,105,259 | 4/1992 | McShane | 357/72 |
| 5,378,924 | 1/1995 | Liang | 257/675 |
| 5,442,234 | 8/1995 | Liang | 361/709 |
| 5,608,267 | 3/1997 | Mahulikar | 257/796 |

FOREIGN PATENT DOCUMENTS

| | | |
|---|---|---|
| 0 469 299 | 2/1992 | European Pat. Off. . |
| 0 545 487 | 6/1993 | European Pat. Off. . |
| 0 548 497 | 6/1993 | European Pat. Off. . |
| 0 562 556 | 9/1993 | European Pat. Off. . |
| 63-133655 | 10/1988 | Japan . |
| 4-186662 | 10/1992 | Japan . |
| 5-190732 | 11/1993 | Japan . |

*Primary Examiner*—Gerald P. Tolin
*Attorney, Agent, or Firm*—Jenkens & Gilchrist; Raymond M. Galasso

[57] ABSTRACT

The present invention relates to a heat-dissipating and supporting structure for a semiconductor electronic device to be encapsulated within a molded plastic material package, of the type having an insulated inner heat sink. In particular, it comprises a heat-sink element which has a first largest surface to be insulated by means of a plastic material layer with a first thickness, and a second largest surface, opposite from the first, to be insulated by means of a layer of plastic material with a second thickness which is thin compared to the first thickness; and a leadframe consisting of a metal strip attached to the heat-sink element on the same side as the first largest surface and comprising a peripheral holder structure located outside the heat-sink element.

Formed in a portion of a side surface of the heat-sink element, is a relief which has mouths located on the first and second largest surfaces of the heat-sink element, the mouth formed on the first largest surface is substantially blocked by an obstructing means which extends to the heat-sink element outside, toward the peripheral holder structure, such as to only leave a slit open between the obstructing means and the peripheral holder structure of the leadframe next to the first largest surface of the heat-sink element. The mouth formed on the second largest surface is open wide.

23 Claims, 4 Drawing Sheets

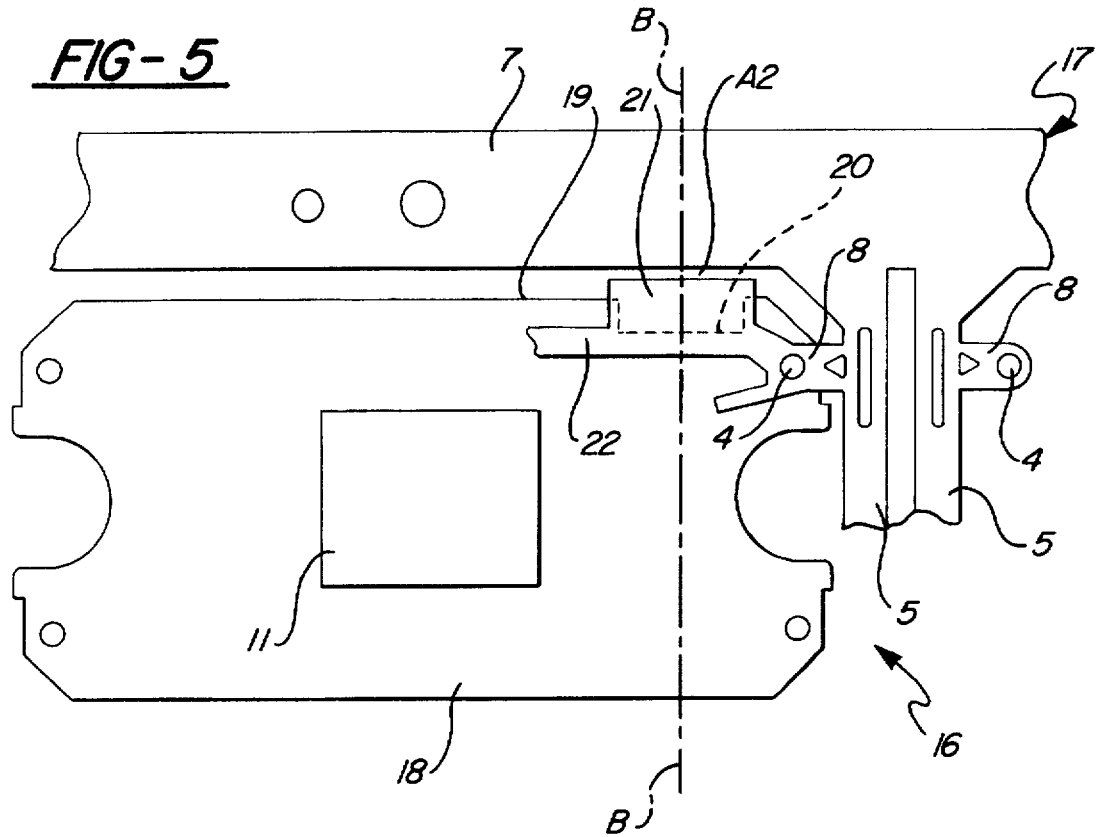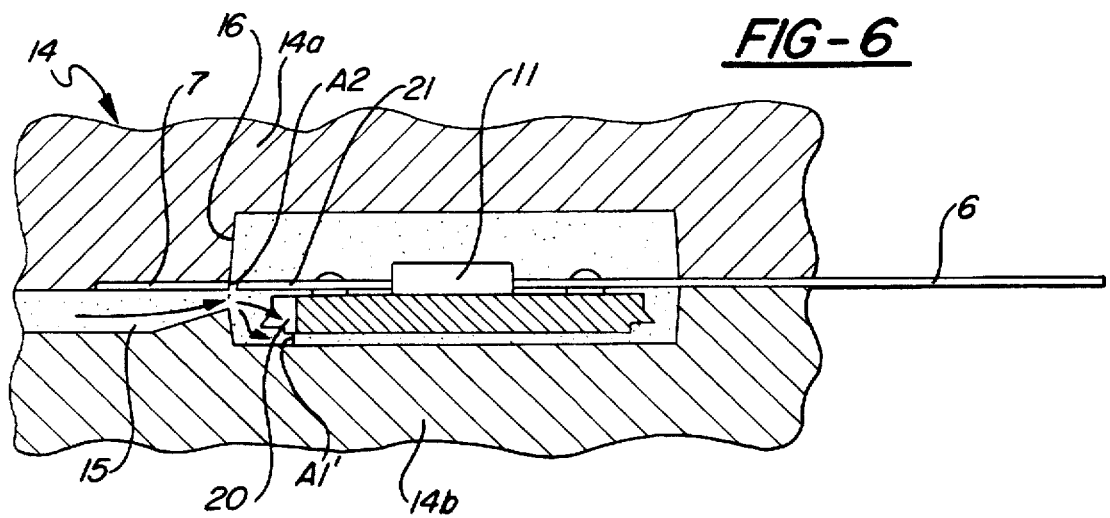

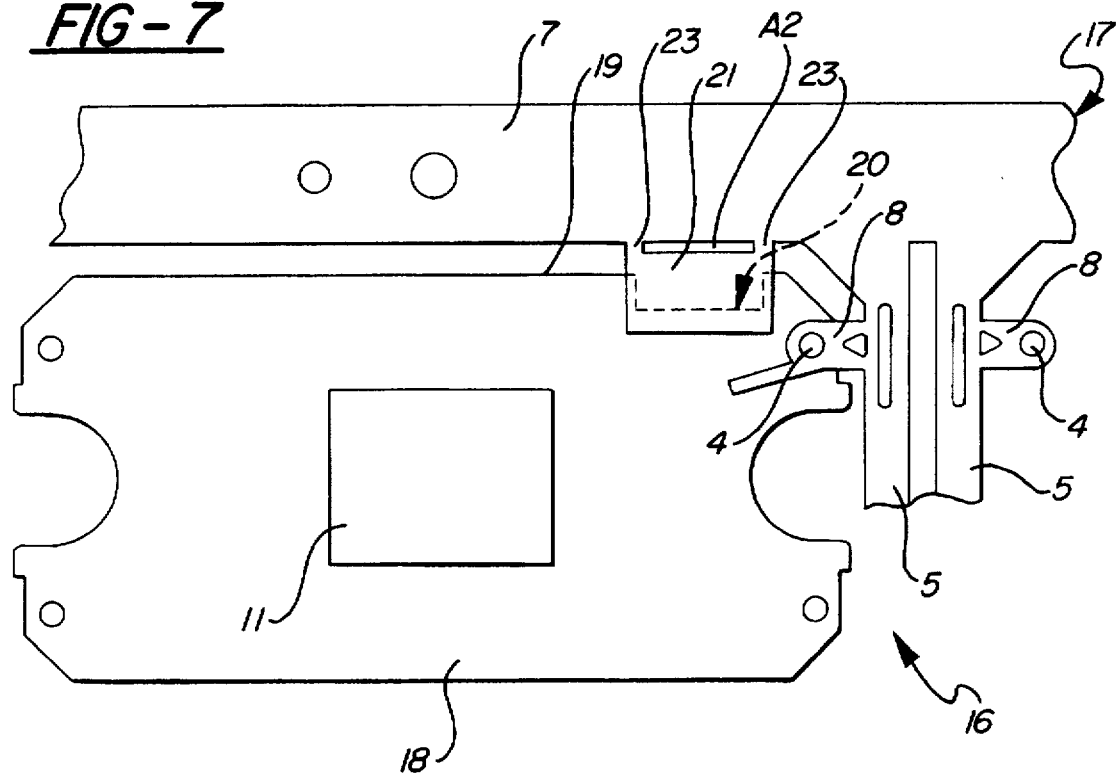
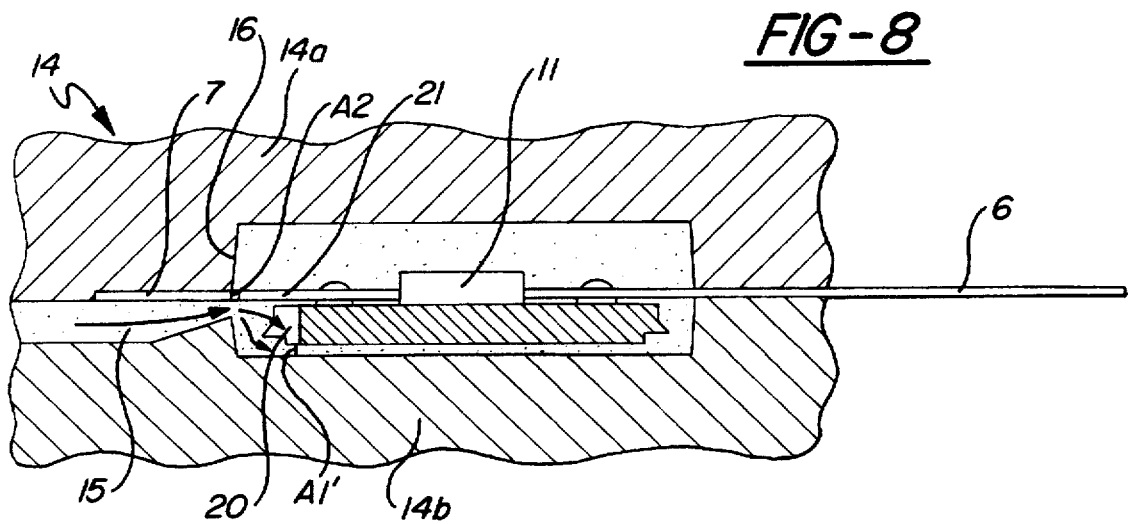

5,793,613

HEAT-DISSIPATING AND SUPPORTING STRUCTURE FOR A PLASTIC PACKAGE WITH A FULLY INSULATED HEAT SINK FOR AN ELECTRONIC DEVICE

FIELD OF THE INVENTION

This invention relates to a heat-dissipating and supporting structure for an electronic device plastic package having a fully insulated heat sink.

This heat-dissipating and supporting structure is of a type which comprises:

- a heat-sink element having a first largest surface to be insulated by means of a plastic material layer with a first thickness, and a second largest surface, opposite from the first, to be insulated by means of a layer of the package plastic material with a second thickness which is thin compared to said first thickness; and
- a leadframe consisting of a metal strip attached to the heat-sink element on the same side as said first largest surface and comprising a peripheral holder structure located outside the heat-sink element.

BACKGROUND OF THE INVENTION

As is well known, semiconductor electronic devices comprise an electric circuit, integrated on a die of a semiconductor material which has a surface area of a few square millimeters. Such devices require, for their connection to an external electronic circuit, appropriate means of support and electrical interconnection which are partially accommodated inside containers or packages intended for protecting the device. The semiconductor material die is mounted fixedly to such means in contact therewith along one of its largest surfaces, while the integrated circuit is exposed on the other large surface.

In order to enable the package to be mounted on a pre-printed electronic board at the end of the manufacturing process, a conducting leadframe is provided on its interior which includes a plurality of electrical connectors having terminations which extend outside the package. Each connector has the other end connected by thin metal wires to a respective metallized area provided on the exposed surface of the die.

The term "power packages" is commonly used to denote electronic power devices, to be described in detail hereinafter, which are apt to develop heat in relatively large amounts, for instance due to the presence on the die of a large density or number of components per unit area, which may include power elements or be designed for operation with large currents. In that case, the supporting structure for the die is also expected to dissipate heat generated within the package and further includes a purposely provided heat-sink element.

The heat sink is a metal element, or other good heat-conducting element, whose mass is larger than that of the die and, hence, of the semiconductor electronic device.

The electronic device is coupled thermally to the heat sink, at the package assembly stage, thereby to promote the transfer of heat during the device operation.

The leadframe is also bonded to the heat sink. The heat sink/metal leadframe assembly is typically replicated a number of times into a continuous strip. The peripheral structure of the individual frames forms a holder structure for the whole set of frames, each leadframe being encapsulated within a single package to form a device.

The structure comprised of the leadframe and heat sink element will be referred to as the "heat-dissipating and supporting structure".

Referring to FIG. 1, a vertical cross-section is schematically shown therein of a typical heat-dissipating and supporting structure, generally designated 1.

For simplicity, this and the following figures illustrate the instance of a structure which is utilized to provide a package of the so-called "single-in-line" type, that is, having connection pins which protrude from a larger side only of the package body. This is a frequently adopted configuration for power packages.

The structure 1 comprises a leadframe 2 and an underlying heat-sink element 3. The leadframe 2 is connected to the heat sink 3, typically at a peripheral region thereof, by means of rivets 4. The heat sink 3 consists of a metal plate which is substantially parallelepipedic in shape.

For mounting the leadframe 2 to the heat sink 3, the leadframe 2 is provided with suitable bars, not shown, which are bored at the locations of studs integral with the heat sink 3. The bars are connected to a peripheral side structure, shown at 5 in FIG. 2, of the leadframe. The free ends of the studs are upset at the time the frame is positioned onto the heat sink. The rivets structure 4 can be seen more particularly in the local cross-sectional view of FIG. 1.

The rivets 4 allow the leadframe 2 to be held slightly raised off the heat sink 3, such that the electric connection between the leadframe 2 and the heat sink 3 will only exist through suitably recessed areas of the leadframe, as shown best in FIG. 2.

For connecting the leadframe 2 to the semiconductor device, not shown, the leadframe includes terminating connectors or leads, indicated at 6, that, once bent over, will form the connection pins.

FIG. 2 is a top view of the heat-dissipating and supporting structure 1 shown in section along A—A in FIG. 1. The structure relating to a single device, and partially that of an adjacent device, are depicted.

The leadframe 2 consists, as mentioned above, of a metal strip blanked off a sheet stock, usually of copper, wherein the same pattern repeats. The corresponding heat sink 3 underneath is shown in ghost outline.

Shown at 7 is a peripheral, frame-holding structure which holds the frames joined in one strip. This peripheral structure also includes said peripheral side structure, shown at 5, formed of legs which are laid vertically to separate adjacent devices. Bars 8 are connected to the peripheral side structure 5 and receive the rivets 4.

Although the leadframe 2 is raised off the heat sink 3, an electric connection between the leadframe 2 and the heat sink 3 is established through a metal line, shown at 9, which is formed from the leadframe and depressed centrally to contact the heat sink 3 in an area 10, as shown in the figure and in accord with a solution taught in European Patent Application 545007 by this Applicant, for example.

Metal leads 6 are defined in the leadframe 2, while still held together by bridge crosspieces which are to form the device connection pins. They extend along a radial sector from a central region of the leadframe 2 to the bottom peripheral holding structure 7 where they are integral constructions.

To explain the aspects of this invention, the usual steps of a conventional package-making process will be reviewed briefly. On a number of structures 1 formed from one sheet metal strip, respective dice are typically mounted.

The die—as described in the aforementioned European Application, for example—is connected, in accordance with a standard technique, directly to the heat sink 3 with no leadframe 2 interposed. Referring to FIG. 2, it is positioned in the central region of the heat sink 3, isolated from the leads 6. In the alternative, the die could be placed onto a central portion of the leadframe 2 which is also connected to the heat-sink 3 element.

Reference will be made in the description to follow to the first case wherein the leadframe, as explained later, includes no die-receiving area. In this case, the die is secured either by soldering, using a low-melt solder such as a lead/tin alloy, or by gluing, using a suitable adhesive such as an epoxy glue. Thereafter, the electric connections to the ends of the leads, which surround the die and are isolated therefrom, are established using thin wires, commonly made of gold.

The strip carrying the dice is then placed into a mold, formed with a cavity at each device location, for the injection at a high temperature of a molten electrically insulating material that is to provide the plastic body of the package. This material is typically a synthetic resin, such as an epoxy resin. The molding operation has several stages at which the temperature is changed gradually to avoid possible cracking in the semiconductor material, or anyway an unreliable device product. The molding operation itself only involves, however, the resin injection step. Following a first cooling step and subsequent curing of the resin to have it thoroughly polymerized, the resultant set of packages are removed from the mold.

Power packages are typically formed such that the heat-sink element will have its bottom surface (not in contact with the die) exposed, that is, not covered by the plastic material, thereby to promote the dissipation of heat toward the package outside, if desired by applying an external heat-sink in contact with this exposed surface.

However, for some applications, it is better to have the heat-sink element fully insulated. Such insulated heat-sink constructions are employed, for example, where the device is to operate on a high voltage and discharges between the grounded heat sink and the printed board or connection pins are to be prevented.

The most commonly used method of providing the insulation is that of covering all of the lower surface with the same material from which the package case is formed.

Shown in FIG. 3 is a power package of the so-called insulated heat-sink type as it appears after the molding operation. The heat-dissipating and supporting structure is the same as that shown in FIG. 1. In FIG. 3, the die mounted on the structure is designated 11.

This structure is partly encapsulated within a case 12 of a plastic material to just leave the ends of the leads 6 on the package exterior. As can be seen, the plastic case 12 has the heat-sink element 3 fully embedded therein.

The bottom surface of the heat sink 3 is covered with a very thin layer 13 of plastic material, so as to keep the thermal resistance of the layer low. In this condition, the transfer of heat to the environment from the heat sink will not be hindered. The term "thin" as applied to the layer 13 refers herein to a trivial thickness compared to the thickness of the plastic material which covers the surface of the heat sink on the die side.

Due to the small thickness of the plastic material 13 that covers the bottom surface of the heat sink 3, certain problems are encountered in its formation.

FIG. 4 illustrates in schematic form the molding operation for making the package shown in FIG. 3. FIG. 4 shows in particular a single-cavity of the mold.

A mold for injection molding with resin is generally shown at 14. It is comprised, in the illustrated embodiment, of an upper half-shell or top mold 14a and a lower half-shell or bottom mold 14b, each having a corresponding recess. The two half-shells are disposed with their recesses opposite to each other to define a mold cavity into which the resin will be injected.

The heat-dissipating and supporting structure 1 is placed between the half-shells 14a and 14b, inside the mold cavity, and placed to leave the ends of the leads 6 outside. Also shown in FIG. 4, on the far side from the leads 6, is a cross-section of a portion of the peripheral holder structure 7 of the leadframe 2 which is left outside the mold cavity, so that it will not be included in the finished package. This peripheral structure is shown best in FIG. 2.

The resin is injected in a molten state through a gate provided on the mold and shown at 15 in FIG. 4. The gate 15 is shown in FIG. 4 with its axis lying substantially horizontal and has an opening to a side surface 16 of the mold cavity. This position of the gate 15 allows the mold cavity to be filled also in its farthest region on the right in the figure from the resin entry. For a uniform resin flow through the mold cavity, it has been found suitable to arrange the gate 15 at a location close to one of the mold corners, i.e. one of the corner edges of the package to be formed.

However, with such a standard molding arrangement, even in its preferential configuration, it is extremely difficult to fully cover, or cover with plastic material to an even thickness, the bottom surface of the heat sink in order to insulate it by means of the insulation layer 13, due to the thin depth of the filling region underlying the heat sink 3.

To illustrate this problem, direction arrows have been used in FIG. 4 to indicate the preferential streamlines for the molten plastic material entering the mold cavity. The melt from the gate 15 flows both toward the top portion of the cavity over the heat-dissipating and supporting structure and the bottom portion beneath the heat sink. However, the melt meets with a greater resistance in its run to the bottom portion of the mold than in the upward direction. The downward flow channel along which the resin is to be flowed has, in fact, a substantially narrow cross-section A1.

Not even the use of a less viscous resin seems to solve the problem so as to invariably ensure uniformity of the plastic material 13 thickness for the heat sink insulation. Nor can the thickness of the plastic layer under the heat sink 3 be increased because this should have a low thermal resistance, as previously mentioned.

The underlying technical problem of this invention is to provide a method for producing a plastic package having a heat sink insulated by an even thin layer of insulating material, so as to optimize the heat transfer capacity of the heat sink 3.

SUMMARY OF THE INVENTION

The solvent idea on which the invention stands is based on the consideration that, to have the bottom surface of the heat sink evenly covered, the flow to the top portion of the package should be retarded. The solution is substantially that of providing the supporting structure of the device with obstructing means for the resin flow passage toward the upper portion of the package during the molding process and simultaneously reducing the drag on the resin flow toward the lower portion of the package.

A heat-dissipating and supporting structure for a semiconductor electronic device to be encapsulated within a molded plastic package provided with an insulated heat-sink comprises a heat-sink element and a metal leadframe. The heat sink has a first largest surface to be insulated by a relatively thick layer of plastic material. A second largest surface, opposite from the first, of the heat sink requires to be insulated by means of a thin layer of the package plastic material after its encapsulation within the package. The leadframe consists of a metal strip attached to the heat-sink element and is disposed on the same side as the first largest surface. The leadframe includes a peripheral holder structure located outside the heat-sink element.

According to the invention, a side surface of the heat-sink element is formed with a relief having mouths respectively located on the first and the second largest surfaces. The mouth on the first largest surface is closed by an obstructing means which is extended to the heat-sink element outside, toward the peripheral structure, such as to only leave a slit unobstructed between the obstructing means and the peripheral structure.

Advantageously, the obstructing means is arranged to form an obstruction in the direction toward the first surface and correspondingly direct the stream of plastic material to the mold cavity portion which accommodates the heat sink. On the other end, the relief in the heat sink allows an opening to be provided for the plastic material to flow toward the second surface of the heat sink.

The underlying technical problem of this invention is solved by a heat-dissipating and supporting structure as indicated above.

The technical problem is also solved by a plastic package with an isolated heat sink as indicated above.

A method of manufacturing a plastic package for an electronic device having an insulated heat sink according to the invention comprises the step of molding the plastic package by introducing a plastic material through a gate provided on an inner surface of a mold where a heat-dissipating and supporting structure for the electronic device is placed therein. The structure is formed to include a heat-sink element which has a first largest surface to be insulated by a layer of plastic material having a first thickness to which a metal leadframe is attached and a second largest surface, opposite from the first, to be insulated by a layer of plastic material having a second thickness that is thin compared to the first thickness. According to the invention, the method further comprises the steps of:

forming, across a portion of a side surface of the heat-sink element, a relief with mouths on the first and second largest surfaces. The mouth next to the first largest surface is closed by an obstructing means which extends to the heat-sink element outside, toward the inner walls of the mold, to only leave a slit unobstructed, whereas the mouth next to the second largest surface is left unrestricted; and placing the relief connected with the mold gate such that the mouth on the second largest surface will promote the flow of plastic material toward said surface, whereas the flow toward the first largest surface is retarded by the obstructing means.

For the purpose of this invention, the spoiler and relief are formed at a mold gate for introducing the molten plastic material during the molding process. Thus, the relief is formed close to a side corner edge of the heat-sink element.

Preferably, the obstructing means comprises a spoiler substantially parallel to the first largest surface of the heat-sink element. The spoiler can advantageously be made in a simple manner during the leadframe blanking step.

The slit between the obstructing means, i.e. the spoiler, and the peripheral structure of the leadframe, lies preferably adjacent to the peripheral structure. In this way, the flow of plastic material toward the first largest surface of the heat-sink element can be further obstructed.

The features and advantages of a structure according to the invention will be apparent from the following description of an embodiment thereof, given by way of example and not of limitation with reference to the accompanying drawings.

BRIEF DESCRIPTION OF THE DRAWINGS

FIG. 5 is a top view of a first embodiment of a structure according to the invention;

FIG. 6 is a sectional view illustrating the molding operation for a package including the structure of FIG. 5;

FIG. 7 is a top view of a second embodiment of the invention; and

FIG. 8 is a sectional view illustrating the molding operation for the second embodiment of the invention.

DETAILED DESCRIPTION OF THE INVENTION

Figure 1:
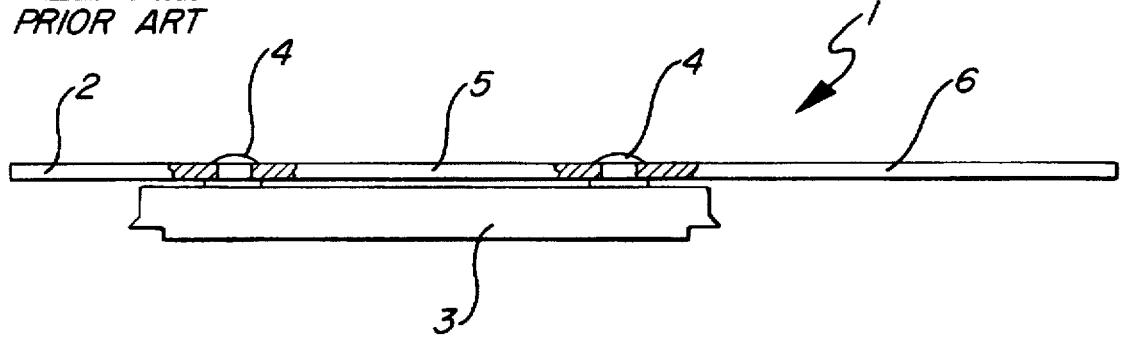
FIG. 1 is a sectional view showing schematically a prior art heat-dissipating and supporting structure.
Figure 2:
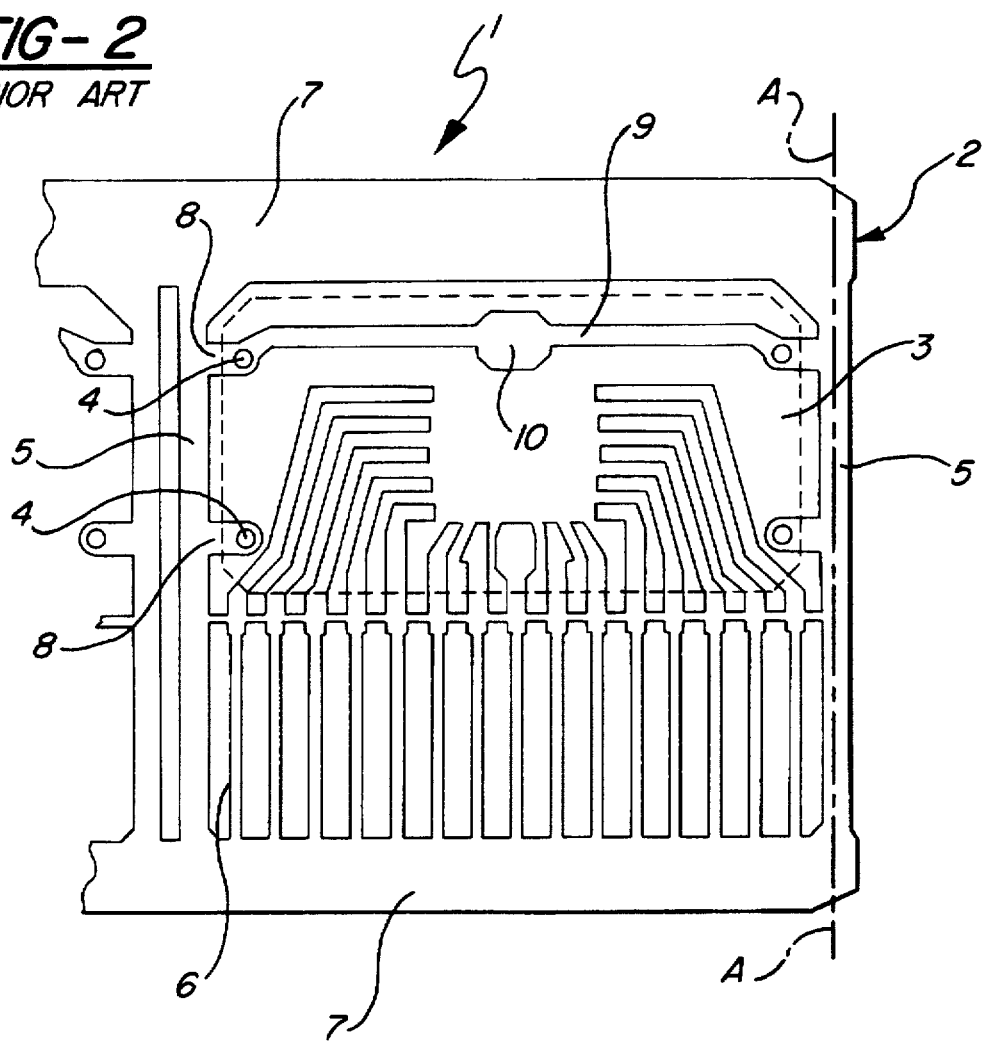
FIG. 2 is a top view of a similar structure to that in FIG. 1.
Figure 3:
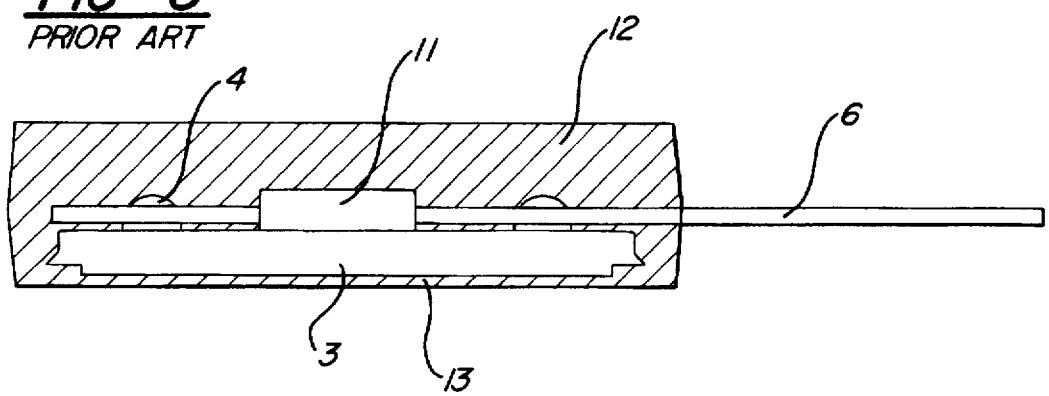
FIG. 3 is a sectional view of a plastic package with an insulated heat sink.
Figure 4:
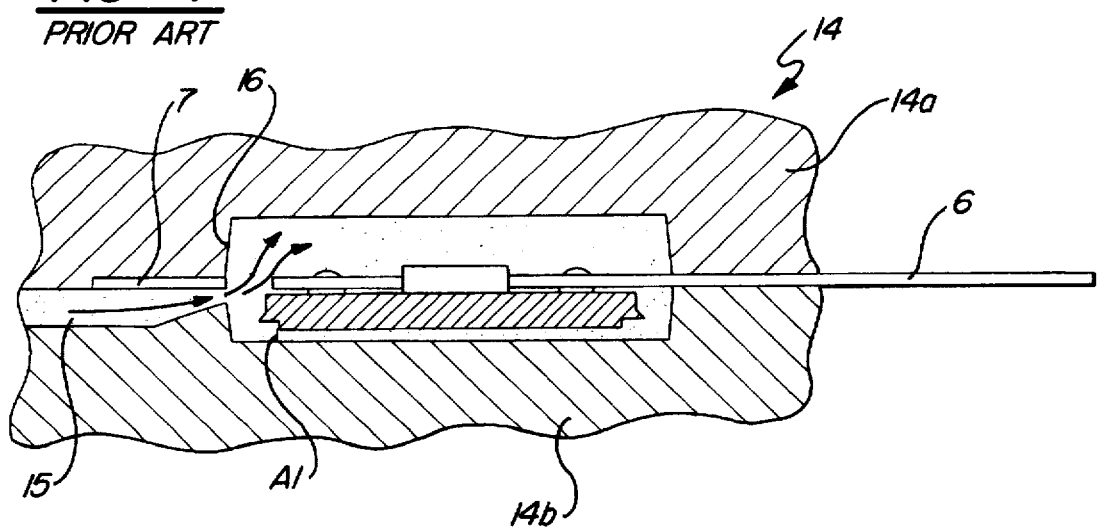
FIG. 4 illustrates the molding operation for a prior-art package with an insulated heat sink.

Depicted in FIGS. 5 and 6 are a first embodiment of a heat-dissipating and supporting structure according to the invention and its behavior during the operation of molding a package in which it is encapsulated. Like parts and elements, and parts and elements serving similar functions, retain in these figures the same reference numerals as in the preceding figures.

FIG. 5 is a top view of a portion of a heat-dissipating and supporting structure 16 associated with a single device. For simplicity, only those parts which are affected by this invention are shown, it being assumed that the remaining parts are conventional.

In this example, a structure for a package of the single-in-line type is shown wherein the electric connection pins jut out of only one large side of the formed package.

The structure 16 comprises a leadframe 17 which consists of a metal strip holding together a set of replicated structures and is mounted on a heat-sink element 18. The leadframe 17 is blanked off a sheet stock, preferably a copper sheet.

A peripheral holding structure 7 of the leadframe 17 allows the frames in one strip to be connected together. It is only shown in FIG. 5 at the upper portion of the leadframe 17, although it also forms the lower end of the strip, not shown and connected to the terminations of electric connectors or leads for connecting the device electrically.

The peripheral structure 7 includes, as previously mentioned in relation to the prior art, in this particular preferred embodiment, a peripheral side structure which has vertical legs 5 arranged to separate the individual devices. Connected thereto are orthogonally extending bars 8 which are bored to accommodate rivets 4 for fastening the leadframe 17 and single heat-sink element 18 to each other.

Only one of the largest surfaces, specifically the upper surface, of the heat-sink element 18 is shown. Its central portion accommodates the die, indicated at 11.

According to this invention, a relief 20 is provided in a side surface, specifically the surface designated 19, of the heat-sink element 18. The relief 20 has a pair of mouths at the largest surfaces of the heat-sink element 18. The relief 20, of which only the top surface mouth is shown in ghost outline, has an axis substantially orthogonal with the largest surfaces of the heat-sink element 18. By way of example, the relief shape may be substantially parallelepipedic in this embodiment. This construction is preferable on account of its simplicity.

Illustratively, the relief cross-section has a width which is about ⅓ the length of the side 19 of the heat sink along which it extends.

In accordance with the invention, moreover, a spoiler, designated 21, is formed integrally with the leadframe 17 to close the top mouth of the relief 20 and extends beyond the perimeter of the heat-sink element 18. In this first embodiment of the invention, the spoiler 21 is attached to an inner structure of the leadframe, generally shown at 22, whence it extends toward the perimeter of the heat-sink element and farther toward the peripheral structure 7.

Only a slit of a much smaller size than that provided in a conventional structure is left between the spoiler 21 and the peripheral structure 7 of the leadframe 17.

This promotes the formation, during the molding of the package plastic case, of a uniquely even insulation thickness across the bottom surface of the heat sink.

The spoiler and relief are formed in the proximity of a corner edge of the side surface of the heat sink, that is at a resin inlet gate of the mold.

To illustrate what happens during the package molding, FIG. 6 shows a vertical cross-section through a mold 14 into which a heat-dissipating and supporting structure like that shown in FIG. 5 has been placed. The section has been taken through the structure along the line B—B in FIG. 5. FIG. 6 shows a single mold cavity for molding a single package.

The mold 14 comprises a pair of half-shells, namely an upper half-shell or top mold and a lower half-shell or bottom mold, designated 14a and 14b, which are arranged with their respective recesses to form a single mold cavity. The mold construction is conventional.

The heat-dissipating and supporting structure 16 is placed into the cavity between the two half-shells. The ends of the leads 6 and the peripheral structure of the leadframe 7 are left outside the cavity. Notice that the structure is positioned with its side to the inner part of the leadframe in contact with one of the side surfaces, designated 16, of the mold cavity.

During the molding operation, the molten plastic material, typically an epoxy resin, is poured into the mold cavity through a gate 15. By way of example, the gate 15 is shown in FIG. 6 as formed in the bottom mold 14b but could, in a different embodiment, be formed in the top mold 14a, or both. In addition, the mold could comprise no such half-shell pair. In any case, the gate 15 is laid with its main axis substantially horizontal, and has an opening on the side surface 16 of the mold cavity. Specifically, the gate 15 is provided proximate to one of the mold corners, i.e. to one of the corner edges of the package being formed.

As shown in FIG. 6, according to the invention, the spoiler 21 and relief 20 are formed proximate to the gate 15 through which the resin is poured into the mold cavity.

By providing the spoiler 21 to partially close the upward passage of the molten material, according to this invention, filling the package side over the heat sink is no longer preferential. Furthermore, the relief 20, shown in cross-section, allows a drain channel to be provided to ease the resin flow toward the lower surface of the heat sink.

In other words, the slit, shown in cross-section at A2, between the side surface 16 of the mold 14 or the peripheral structure of the leadframe 7 and the spoiler 21 is comparable to the downward passage channel A1', which further has said drain.

Thus, the preferential streamlines of the molten material, shown in the figure, point downwards. This promotes filling of the cavity between the heat sink 18 and the bottom surface of the mold cavity, thereby providing an even and thin layer of resin beneath the heat sink to suitably insulate it.

Preferably, the cross-sectional dimensions would be selected to cause the resin to flow through the mold upper portion, rightward in the figure, at the same rate as under the heat sink.

With further reference to FIG. 5, the spoiler shape is substantially the homolog of the relief shape and of a larger size, thereby projecting outside the heat sink on the side of the peripheral frame structure 7. The spoiler is shaped to overlap the heat sink relief, so as to promote a flow of molten plastic material toward the bottom surface of the heat sink during the molding operation.

FIG. 7 shows a top view of a heat-dissipating and supporting structure according to a second embodiment of the invention.

In this second embodiment, the spoiler 21 is formed enbloc with the leadframe 17 but connected to the peripheral structure 7 of the leadframe.

In particular, for the connection, at least one brace is provided to define a slit between the peripheral structure and the spoiler. In FIG. 7, the preferred embodiment includes two braces 23 bounding the slit laterally.

By providing the braces 23, the peripheral structure of the leadframe 17 can be removed, after molding the package, while keeping the spoiler 21 therein, which spoiler is to stay of necessity within the mold cavity during the package molding.

FIG. 8 shows a vertical cross-section view of a heat-dissipating and supporting structure constructed in accordance with this second embodiment. The slit for the passage of the resin to the top portion of the mold is here shown in dash lines. It is at the same position of the slit of the other embodiment. The resin behavior will, therefore, be similar to that shown in FIG. 6.

While this invention has been particularly illustrated in connection with a package of the single-in-line type, the invention could be alternatively applied to packages wherein the connection pins jut out of two opposite sides of the case. Such structures are referred to as being of the "dual-in-line" or DIP type. In this case, the spoiler would locate on one side, at 90 degrees with those from which the pins protrude. The present invention applies generally to any packages having insulated heat sinks.

Notice that the spoiler could be formed other than integral with the leadframe, and be affixed thereto. Also, it may be replaced with some different obstructing means, having different shapes, even non-bidimensional ones, depending on the preferential technique employed to form the structure, for example.

The relief shown in the figures is parallelepipedic in shape, but it would still retain its functionality were its shape altered, e.g., to include, for example, bevelled corners.

Of course, the heat-dissipating and supporting structure as described above and illustrated may be modified and altered within the invention scope as defined in the following claims.

What is claimed is:

1. A heat-dissipating and supporting structure for a semiconductor electronic device to be encapsulated within a plastic package, formed by a molding process, of the type having a fully insulated heat sink, comprising:
   a heat-sink element having a first largest surface to be insulated by means of a plastic material layer with a first thickness, and a second largest surface, opposite from the first largest surface, to be insulated by means of a layer of plastic material with a second thickness which is thin compared to the first thickness; and
   a leadframe consisting of a metal strip attached to the heat-sink element on the same side as the first largest surface and comprising a peripheral holder structure located outside as regards the heat-sink element; and wherein
   a portion of a side surface of the heat-sink element is formed with a relief having mouths located on the first and second largest surfaces of the heat-sink element, the mouth formed on the first largest surface being substantially blocked by an obstructing means which extends outside to the heat-sink element, toward the peripheral holder structure, such as to only leave a slit open between the obstructing means and the peripheral holder structure of the leadframe toward the first largest surface of the heat-sink element, and the mouth formed on the second largest surface being completely open.

2. A structure according to claim 1, wherein the obstructing means is shaped to be superimposed to the relief of the heat-sink element and favor a flow of molten plastic material toward the second largest surface of the heat-sink element during the molding process.

3. A structure according to claim 1, wherein the slit is adjacent to the peripheral holder structure of the leadframe.

4. A structure according to claim 1, wherein the relief is formed in the proximity of a side corner edge of the heat-sink element.

5. A structure according to claim 1, wherein the obstructing means comprises a spoiler extending substantially parallel to the first largest surface of the heat-sink element.

6. A structure according to claim 5, wherein the spoiler is formed enbloc with the leadframe.

7. A structure according to claim 6, wherein the spoiler is connected to an inner structure of the leadframe whence it is extended outside the heat-sink element toward the peripheral holder structure.

8. A structure according to claim 6, wherein the spoiler is connected to the peripheral holder structure of the leadframe by at least one brace.

9. A structure according to claim 6, wherein the spoiler is connected to the peripheral holder structure of the leadframe by a pair of braces setting the length of the slit.

10. A structure according to claim 5, wherein the spoiler shape is substantially the homolog of the relief shape and a larger size, so as to protrude outwards from the heat sink on the same side as the peripheral holder structure of the leadframe.

11. A structure according to claim 1, wherein the relief has a substantially orthogonal axis to the first largest surface of the heat-sink element.

12. A structure according to claim 1, wherein the relief width is about ⅕ of the length of the heat sink side along which the relief is formed.

13. A plastic material package for a semiconductor electronic device, of the type having a fully insulated internal heat sink and being formed by a molding process, the plastic material package comprising:
   a heat-sink element having (i) a first largest surface thermally coupled to a semiconductor material die on which the electronic device has been formed, and insulated by means of a plastic material layer with a first thickness, and (ii) a second largest surface, opposite from the first largest surface, insulated by means of a layer of plastic material with a second thickness which is thin compared to the first thickness;
   a metal leadframe attached to the heat-sink element on the same side as the first largest surface and comprising a peripheral holder structure and leads extending toward the package outsides for electrical connection to the electronic device; and wherein
   a portion of a side surface of the heat-sink element is formed with a relief having mouths located on the first and second largest surfaces of the heat-sink element, the mouth formed on the first largest surface being substantially blocked by a obstructing means which extends outside to the heat-sink element, toward the peripheral holder structure, and is detached from the side surface of the package such as to only leave a slit open toward the first largest surface of the heat-sink element and leave the mouth to the second largest surface open wide.

14. A plastic material package according to claim 13, wherein the obstructing means is shaped to be superimposed to the relief and to promote a flow of molten plastic material toward the second largest surface of the heat-sink element during the molding process.

15. A plastic material package according to claim 13, wherein the relief is formed in the proximity of a side corner edge of the heat-sink element.

16. A plastic material package according to claim 13, wherein the obstructing means comprises a spoiler extending substantially parallel to the first largest surface of the heat-sink element.

17. A plastic material package according to claim 16, wherein the spoiler is connected to an inner structure (22) of the leadframe whence it is extended toward the side surface of the package.

18. A plastic material package according to claim 16, characterized in that the spoiler is detached from the leadframe.

19. A plastic material package according to claim 16, characterized in that the spoiler shape is substantially the homolog of the relief shape and a larger size, so as to protrude outwards from the heat sink.

20. A plastic material package according to claim 13, characterized in that the relief has a substantially orthogonal axis to the first largest surface of the heat-sink element.

21. A plastic material package according to claim 13, characterized in that the relief width is about ⅕ of the length of the heat sink side along which the relief is formed.

22. A method of manufacturing a plastic material package for an electronic device having an insulated heat sink comprising: molding the plastic package by introducing a plastic material through a mold gate provided on an inner surface of a mold in which a heat-dissipating and supporting structure for the electronic device is placed, the structure being arranged to include a heat-sink element which has a first largest surface to be insulated by a layer of plastic material having a first thickness and on which a metal leadframe is attached, and a second largest surface, opposite from the first largest surface, to be insulated by a layer of plastic material having a second thickness which is thin compared to the first thickness; and wherein a portion of a side surface of the heat-sink element is formed with a relief which has mouths on the first and second largest surfaces, the mouth to the first largest surface being substantially blocked by an obstructing means which extends to the heat-sink element outside, toward the inner walls of the mold, to only leave a slit unobstructed, whereas the mouth to the second largest surface is left completely open; and the relief is placed connected to the mold gate such that the mouth on the second largest surface will favour the flow of plastic material toward the surface and the flow toward the first largest surface is retarded by the obstructing means.

23. A method according to claim 22, wherein the slit is adjacent to the side surface of the mold.

* * * * *

UNITED STATES PATENT AND TRADEMARK OFFICE
CERTIFICATE OF CORRECTION

PATENT NO. : 5,793,613
DATED : August 11, 1998
INVENTOR(S) : Renato Poinelli & Marziano Corno It is certified that error appears in the above-identified patent and that said Letters Patent is hereby corrected as shown below: TITLE PAGE The priority information is as follows:

[30]    Foreign Application Priority Data

December 29, 1995  [EP]   European Pat. Off. . . . . . . . . 95830551.8

Signed and Sealed this

Sixteenth Day of March, 1999

*Attest:*

Q. TODD DICKINSON

*Attesting Officer*   Acting Commissioner of Patents and Trademarks